Figure 1:
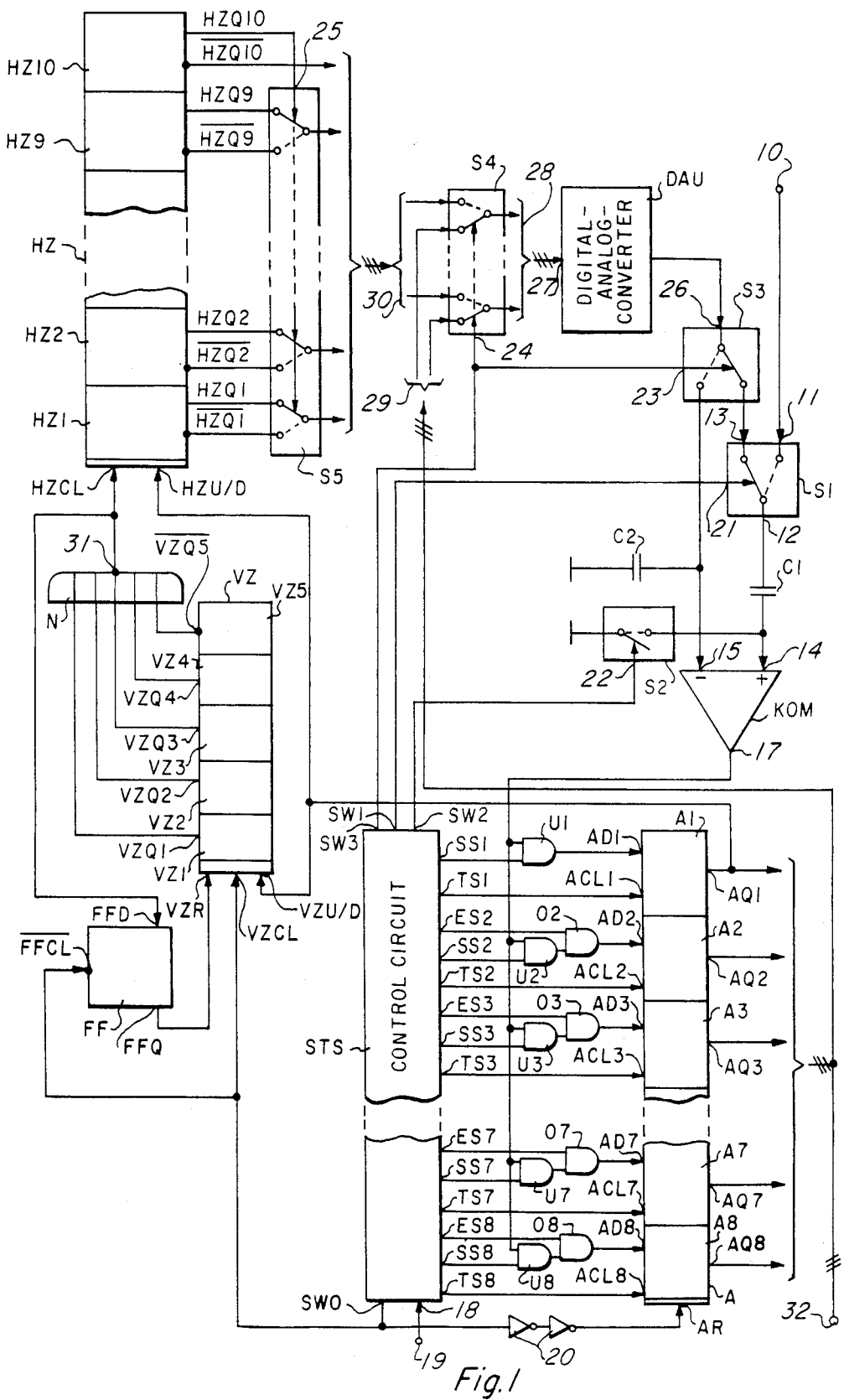

United States Patent [19]

Bosserhoff et al.

[11] Patent Number: 4,524,346

[45] Date of Patent: Jun. 18, 1985

[54] CIRCUIT ARRANGEMENT FOR CONVERTING AN ANALOG AC VOLTAGE SIGNAL TO A DIGITAL SIGNAL

[75] Inventors: Hartmut Bosserhoff, Allershausen; Wolfgang Steinhagen, Mauern; Ulrich Joeres, Freising, all of Fed. Rep. of Germany

[73] Assignee: Texas Instruments Incorporated, Dallas, Tex.

[21] Appl. No.: 394,980

[22] Filed: Jul. 2, 1982

[30] Foreign Application Priority Data

Jul. 3, 1981 [DE] Fed. Rep. of Germany ....... 3126380

[51] Int. Cl.$^3$ ............................................. H03K 13/02
[52] U.S. Cl. ........................ 340/347 CC; 340/347 AD; 340/347 M; 375/19
[58] Field of Search ................. 340/347 CC, 347 AD, 340/347 M; 375/19

[56] References Cited

U.S. PATENT DOCUMENTS

| | | | |
|---|---|---|---|
| 3,495,238 | 2/1970 | Gabriel | 340/347 CC |
| 3,654,560 | 4/1972 | Cath et al. | 340/347 NT X |
| 3,740,532 | 6/1973 | Esch | 377/50 X |
| 4,097,860 | 6/1978 | Araseki et al. | 340/347 CC |

Primary Examiner—T. J. Sloyan
Attorney, Agent, or Firm—Richard A. Bachand; N. Rhys Merrett; Melvin Sharp

[57] ABSTRACT

Analog AC to digital signal converter includes a sampling circuit which cyclically samples the analog AC signal to form analog sampling values, and an analog-digital converter for converting the analog sampling values to digital sampling values. A sign integrator integrates the sign of the digital sampling values, and a compensating voltage generator generates a compensating voltage in dependence upon the integration result. A combination circuit combines the compensating voltage with the analog sampling value from the sampling means and applies the combination result to the analog-digital converter. The circuit compensates any DC voltage component contained in the analog AC signal and avoids interferences resulting from such DC voltage component.

3 Claims, 3 Drawing Figures

Fig. 3

| HZU/D | HZQ10 | $\overline{HZQ10}$ | ... | HZQ3 | $\overline{HZQ3}$ | HZQ2 | $\overline{HZQ2}$ | HZQ1 | $\overline{HZQ1}$ | COUNTER OUTPUT (DECIMAL VALUE) |
|---|---|---|---|---|---|---|---|---|---|---|
| 0 | 0 | 1* |  | 0* | 1 | 1* | 0 | 1* | 0 | +3 |
| 0 | 0 | 1* |  | 0* | 1 | 1* | 0 | 0* | 1 | +2 |
| 0 | 0 | 1* |  | 0* | 1 | 0* | 1 | 1* | 0 | +1 |
| 0 | 1 | 1* |  | 0 | 1 | 0* | 1 | 0* | 1 | +0 |
| 0 | 1 | 0* |  | 1 | 0* | 1 | 0* | 1 | 0* | −0 |
| 0 | 1 | 0* |  | 1 | 0* | 1 | 0* | 0 | 1* | −1 |
| 0 | 1 | 0* |  | 1 | 0* | 0 | 1* | 1 | 0* | −2 |
| 0 | 1 | 0* |  | 1 | 0* | 0 | 1* | 0 | 1* | −3 |
| 1 | 1 | 0* |  | 1 | 0* | 0 | 1* | 1 | 0* | −2 |
| 1 | 1 | 0* |  | 1 | 0* | 1 | 0* | 0 | 1* | −1 |
| 1 | 0 | 1* |  | 0* | 1 | 0* | 1 | 1 | 0 | −0 |
| 1 | 0 | 1* |  | 0* | 1 | 0* | 1 | 0 | +0 |    |
| 1 |   |    |  |    |   |    |   |   |   | +1 |

CIRCUIT ARRANGEMENT FOR CONVERTING AN ANALOG AC VOLTAGE SIGNAL TO A DIGITAL SIGNAL

The invention relates to a circuit arrangement for converting an analog AC voltage signal to a digital signal comprising a sampling means which cyclically samples the analog AC voltage signal and forms analog sampling values, and an analog-digital converter for converting the analog sampling values to digital sampling values.

By way of example, such a circuit arrangement is used in the transmission of communications signals present as analog AC voltage employing pulse code modulation. In this transmission method the communications signals are sampled, the analog sampling values thereby formed converted to digital sampling values and the digital sampling values supplied to the transmission path. For distortion-free transmission there must be no disturbance signal in the form of a DC voltage component (offset) superimposed on the AC voltage signal. The filtering of the communications signal necessary for employing pulse code modulation prior to the sampling can, however, lead to such an interfering DC voltage component.

The present invention is based on the problem of providing a circuit arrangement of the type mentioned at the beginning such that it permits the compensation of a DC voltage component contained in the signal to be converted.

According to the invention this problem is solved by a sign integrator which integrates the sign of the digital sampling values, a compensation voltage generator which generates a compensation voltage in dependence upon the integration result, and a combination circuit which combines the compensation voltage with the analog sampling value from the sampling means and applies the combination result to the analog-digital converter.

In the circuit arrangement according to the invention, the integration result of the sign integrator contains information on whether the number of the positive sampling values is equal to, greater or smaller than the number of the negative sampling values. The circuit arrangement thereby forms a control loop in which the integration result is used to produce a compensation voltage which is combined with the analog sampling value in the sense of a compensation of a DC voltage component possibly contained in the signal to be converted. The circuit arrangement contains only electronic components which are integratable so that the circuit arrangement can be made in its entirety as an integrated circuit. An advantage of the circuit arrangement according to the invention is that in a stand-by state the compensation voltage can be stored so that upon a further activation of the circuit arrangement only a short building-up time is required. It rapidly reaches the condition in which a DC voltage component contained in the signal to be converted is compensated.

Advantageous further developments of the invention are characterized in the subsidiary claims.

Figure 2:
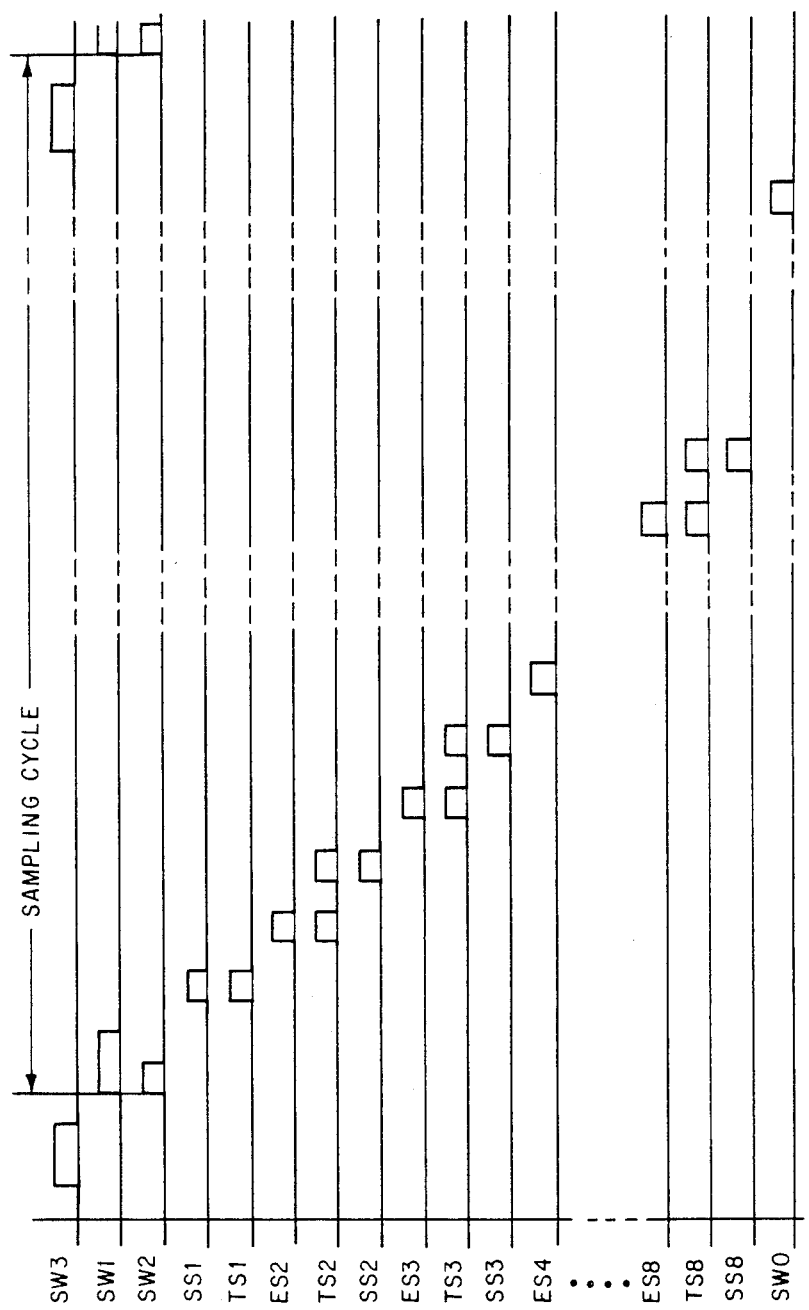

The invention will be explained by way of example with the aid of the drawings, wherein:

FIG. 1 is a circuit diagram of the circuit arrangement according to the invention, FIG. 2 is a diagram for explaining the time sequence of the signals produced by the control circuit of FIG. 1 and FIG. 3 is a Table for explaining the mode of operation of the main counter of FIG. 1.

Before describing the circuit arrangement illustrated in FIG. 1 the intended field of application will be briefly explained because a knowledge of the field of application facilitates understanding of the circuit arrangement to be described. Communications signals are being increasingly transmitted not in the form of analog signals but in the form of digital signals, use being made in particular of pulse code modulation. In this transmission method the analog signal is sampled with a predetermined clock frequency and the sampling values resulting are converted in an analog-digital converter to digital values, so called PCM words. These digital values are then transmitted, obtaining the known advantages of digital signal transmission, for example that of a good signal-to-noise ratio. On the receiver side the analog sampling values are recovered from the digital signals by a digital-analog-conversion and the original signal is obtained by passing the sampling values through a low-pass filter. For the unfalsified recovery of the analog signal the sampling frequency with which the original analog signal is sampled must be at least twice as great as the highest frequency occurring in the analog signal. In practice the frequency band of the analog signal is limited by means of a low-pass filter and the sampling frequency is then made twice as great as the highest frequency allowed to pass by the low-pass filter. The low-pass filter used to limit the frequency band of the analog signal to be transmitted is preferably made up using active filters which of course contain operational amplifiers. Such active filters with operational amplifiers produce at their output an offset voltage and as a result the analog signal to be transmitted includes an undesirable DC voltage component. This undesirable DC voltage component must be removed before converting the sampling values of the analog signal to avoid falsification of the information. The circuit arrangement to be described permits the conversion of the sampling values of the analog voltage to digital signals with simultaneous compensation of any DC voltage component contained in the analog voltage.

The circuit arrangement illustrated in FIG. 1 comprises an input terminal 10 to which the analog signal to be transmitted is applied after said signal has been sent through the previously mentioned low-pass filter. The input terminal 10 is connected to a signal input 11 of a switch S1 which in one of its switching positions, which is indicated in dashed line in the illustration, applies an analog signal at the input 10 to a capacitor C1 whose one terminal is connected to the output 12 of the switch S1. The position of the switch S1 is defined by a switching signal which can be applied to its control input 21. The other terminal of the capacitor C1 is connected to an input 14 of a comparator KOM, to the second input 15 of which a terminal of a second capacitor C2 is connected. The other terminal of said capacitor C2 is connected to ground. Between the input 14 of the comparator KOM and ground there is a switch S2 which can apply the input 14 and the terminal of the capacitor C1 connected thereto to ground. The position of the switch S2 is defined by a switching signal which can be applied to its control input 22. The output 17 of the comparator KOM is connected to a respective input of a series of AND circuits U1 to U8. The other inputs of these AND circuits U1 to U8 are connected to write signal outputs SS1 to SS8 of a control circuit STS.

The comparator KOM is an operational amplifier which is provided with a differential input and the feedback circuit of which is open so that the voltage at the output 17 has a high value associated with the signal value "1" when the voltage at the input 14 is lower than the voltage at the input 15 whilst it has a low value associated with the signal value "0" when the voltage at the input 14 is higher than the voltage at the input 15.

The circuit arrangement further includes an output register A which comprises eight stages A1 to A8 each formed by a flip-flop. In the drawings, for simplicity not all the stages have been shown as indicated by the interruptions in the border lines of the output register A.

The individual stages A1 to A8 each have a data input AD, a clock input ACL and an output AQ. In the drawings these connections are associated with the stages A1 to A8 respectively by adding the numbers 1 to 8. The flip-flops forming the individual stages A1 to A8 are set to the particular condition which the signal at the data input AD has at the instant of occurrence of the clock signal at the clock input ACL. At the output AQ of each stage a signal is furnished which represents the state of the flip-flop, i.e. either a signal with the value "0" or a signal with the value "1". The output register A can be reset by means of reset pulses applied to a reset input AR.

Connected to the data inputs AD of the output register stages A2 to A8 are the outputs of OR circuits O2 to O8 which comprise an input connected to a setting signal output ES of the control circuit STS and an input connected to the output of in each case one AND circuit U. As already mentioned, one input of each of the AND circuits U is connected to the output 17 of the comparator and a further input of each of these AND circuits is connected to a write signal output SS of the control circuit STS. The OR circuits O, AND circuits U, write signal outputs SS, clock signal outputs TS and setting signal outputs ES associated with the respective stages A1 to A8 of the output register A are designated by adding the respective number of the output register stage.

The control circuit STS comprises a main clock input 18 at which it receives a main clock signal applied to the terminal 19. At the output SW0 the control circuit STS furnishes a clock signal which is recovered from the main clock signal and the purpose of which will be explained hereinafter. The control circuit STS furnishes at a further output SW1 the switching signal which for actuating the switch S1 is applied to the control input 21 thereof. The control circuit STS furnishes at a further output SW2 the switching signal actuating the switch S2. A switching signal furnished at an output SW3 of the control circuit STS passes to the control input 23 of a further switch S3 and to the control input 24 of a multiple switch S4.

The circuit arrangement includes a digital-analog converter DAU whose output signal is applied to the signal input 26 of the switch S3 and, in dependence upon the switching condition thereof, can be applied to the signal input of the switch S1 or to the input 15 of the comparator KOM. The digital-analog converter DAU comprises inputs 27 which receive the signal furnished by the outputs 28 of the multiple switch S4. Depending on its position, the multiple switch S4 switches either its signal inputs 29 or its signal inputs 30 its outputs 28. The signal inputs 29 of the multiple switch S4 are connected to the outputs AQ1 to AQ8 of the output register A, the connecting line being a multi-core conductor. Thus, the content of the output register A, including the sign bit, is transmitted in parallel via the multiple switch S4 with the corresponding switch position to the digital-analog converter DAU.

The circuit arrangement also includes a binary precounter VZ having five counter stages VZ1 to VZ5. Said precounter VZ changes its count with each clock pulse applied to its clock input VZCL by the output SW0 of the control circuit STS. A signal applied to its input VZU/D and coming from the output AQ1 of the stage A1 of the output register A determines whether the precounter VZ counts up or down. The precounter VZ can be reset by means of a signal applied to the input VZR. The outputs VZQ1 to VZQ4 of the precounter VZ are connected to four inputs of an NOR circuit N; at said outputs VZQ1 to VZQ4 the stages VZ1 to VZ4 of the precounter VZ furnish in each case a signal in non-negated form corresponding to the state of the respective stage. The output $\overline{VZQ5}$ of the counter stage VZ5 is also connected to an input of the NOR circuit N; said output $\overline{VZQ5}$ furnishes a signal in negated form corresponding to the condition of the counter stage VZ5. The output 31 of the NOR circuit N is connected to the data input FFD of a flip-flop FF which comprises an output FFQ connected to the input VZR of the precounter VZ. The flip-flop FF also comprises a clock input $\overline{FFCL}$ which is connected to the output SW0 of the control circuit STS. The clock input FFCL of the flip-flop FF is so constructed that it responds to the negative edge of a clock pulse applied thereto which means that the signal value present at the data input FFD is carried over into the flip-flop FF with the negative edge of the clock signal.

The output 31 of the NOR circuit N is also connected to the clock input HZCL of a main counter HZ which is a conventional binary counter with 10 counter stages HZ1 to HZ10. The main counter HZ counts in dependence upon the signals applied to its input HZU/D up or down in time with the pulses applied to its clock input HZCL. Each stage of the main counter HZ comprises a non-negating output HZQ and negating output $\overline{HZQ}$; the association of the output with the respective counter stages HZ1 to HZ10 is shown by the addition of the digit corresponding to the stage number.

Depending on its position, a multiple switch S5 selectively connects the non-negating outputs HZQ or the negating outputs $\overline{HZQ}$ of the counter stages HZ1 to HZ9 to the signal inputs 30 of the multiple switch S4. The position of the multiple switch S5 is determined by the signal applied to the control input 25 thereof and coming from the non-negating output HZQ10 of the counter stage HZ10. When this signal has the value "0" the multiple switch S5 assumes the switching position which is illustrated in full lines and in which the non-negating outputs HZQ1 to HZQ9 are connected to the signal inputs 30 of the multiple switch S4. When however this signal has the value "1" the multiple switch S5 connects the negating outputs $\overline{HZQ1}$ to $\overline{HZQ9}$ to the signal inputs 30 of the multiple switch S4. The signal at the negating output $\overline{HZQ10}$ is continuously transmitted to an associated input 30 of the multiple switch S4 which belongs to the input 29 which receives the sign bit from the stage A1 of the output register A.

The arrangement comprising the main counter HZ and the multiple switch S5 represents an algebraic binary counter which can count positive and negative numerical values, the bit in the counter stage HZ10 indicating the sign whilst the content of the nine counter stages HZ1 to HZ9 represents the quantity. The main counter HZ thus has a counting capacity of −511 to +511. It is assumed that the value "1" at the output $\overline{HZQ10}$ of the counter stage HZ10 represents the positive sign. When the value "1" is at the output HZQ10, i.e. the sign is negative, due to the switching of the multiple switch S5 the count of the counter stages HZ1 to HZ9 is not taken from the direct outputs HZQ1 to HZQ9 but from the complementary outputs $\overline{HZQ1}$ to $\overline{HZO9}$. As a result, the quantities of the negative numbers, proceeding from 0, appear in the same dual number representation as the quantities of the positive numbers.

Depending on the position of the switch S3 the voltage furnished by the digital-analog converter DAU can be applied to the input 15 of the comparator KOM or with appropriate position of the switch S1 to the capacitor C1. By means of the switch S1 the analog signal at the input terminal 10 can also be applied to the capacitor C1, as already mentioned above.

With the aid of the circuit arrangement described an analog signal present as AC voltage at the input terminal 10 can be converted to a digital signal which can be taken from the output 32. Any undesirable offset voltage contained in the AC voltage signal, i.e. a DC voltage component, is compensated by the circuit arrangement. It will now be described in detail how this is achieved.

For the description of the mode of operation it will first be assumed that the analog signal at the input terminal 10 is an offset-free signal, i.e. does not contain any DC voltage component. It will further be assumed that all the stages of the output register A, the precounter VZ and the main counter HZ have the content "0" and that the switches S1, S2, S3, S4 and S5 are in the switching positions indicated in full lines.

The sequence of the pulses referred to hereinafter and furnished by the control circuit STS in the course of a sampling cycle is indicated in the diagram of FIG. 2. On the left edge the reference numerals of the outputs at which the pulses appear are indicated. For simplification the pulses are designated by the same reference numerals. The control circuit STS produces these pulses with synchronisation by the clock signal applied to its main clock input 18.

Before the start of the sampling cycle the control circuit STS furnishes at the output SW3 a pulse which is transmitted as switching signal to the control input 23 of the switch S3 and to the control input 24 of the multiple switch S4 so that these two switches are switched into their positions indicated in each case in dashed lines. In this switching position the switch S3 connects the output of the digital-analog converter DAU to the input 15 of the comparator KOM and in this switching position the multiple switch S4 connects the outputs of the main counter HZ connected to the signal inputs 30 to the inputs 27 of the digital-analog converter DAU. With the starting conditions referred to the outputs HZQ1 to HZQ9 are connected via the multiple switches S5 and S4 to the digital-analog converter DAU because the stage HZ10 of the main counter HZ has the content "0" so that the multiple switch S5 assumes the switching position indicated in full lines. The digital-analog converter DAU thus receives at its inputs 27 a number represented by digital signals and having a positive sign and the quantity zero which it converts to a compensation voltage with the value 0 V and applies to the input 15 of the comparator KOM. The capacitor C2 stores the voltage value applied by the digital-analog converter DAU to the comparator input 15 for the entire duration of the sampling cycle when the switch S3 after the termination of the switching pulse SW3 has again returned to the switching position indicated in full line.

Simultaneously with the switch S3, at the end of the switching pulse SW3 the multiple switch S4 also returns to the position illustrated in full lines. The outputs AQ1 to AQ8 of the output register A are thereby connected to the inputs 27 of the digital-analog converter DAU. Since initially all the stages A1 to A8 of the output register A have the condition "0" the digital-analog converter DAU furnishes at its output a voltage having the value 0 V which is transmitted via the switch S3 to the signal input 13 of the switch S1.

As apparent from the pulse diagram of FIG. 2, at the start of the sampling cycle a pulse SW1 is produced by the control circuit STS and passes to the control input 21 of the switch S1 so that said switch switches to the switching position indicated in dashed line and transfers the analog voltage applied to its signal input 11 from the input terminal 10 to its output 12 and thus to the capacitor C1. Simultaneously with the pulse SW1 the control circuit STS also produces a pulse SW2 which closes the switch S2 so that the terminal of the capacitor C1 connected to the input 14 of the comparator KOM is applied to ground. Said capacitor C1 is thereby charged to the analog voltage at the input terminal 10 at the end of the pulse SW2. It is assumed that at the instant of its sampling, the analog voltage at the input terminal 10 has a positive value.

With the termination of the pulse SW2, the switch S2 is opened. The voltage stored in the capacitor C1 then represents the sampling value of the analog voltage which is retained for the entire duration of the sampling cycle until the next closing of the switch S2 because the charge of the capacitor cannot change via the high-impedance input of the comparator KOM. The pulse SW2 preferably ends earlier than the pulse SW1 to prevent discharging of capacitor C1. On completion of the switching pulse SW1, the switch S1 also again returns to its switching position illustrated in full line. As a result, the input 14 of the comparator KOM there is now a voltage which corresponds to the difference between the voltage at the signal input 13 and the sampling value stored in the capacitor C1. As already mentioned, the digital-analog converter DAU furnishes in this stage at its output a voltage having the value 0 V which is applied via the switch S3 to the signal input 13. The comparator KOM thus receives at the input 14 a negative voltage with the magnitude of the sampling value whilst at the input 15 there is the compensation voltage of 0 V stored in the capacitor C2. Since therefore the voltage at the input 15 is higher than the voltage at the input 14 the comparator KOM furnishes at an output 17 a signal having the value "1". With this first comparison made by the comparator KOM the sign of the analog voltage sampled by the switch S1 at the input terminal 10 can be determined.

The signal with the value "1" appearing at the output 17 of the comparator KOM passes to an input of each of the AND circuits U1 to U8 as apparent in FIG. 1. The pulse diagram of FIG. 2 shows that the control circuit STS now furnishes simultaneously a pulse at its write output SS1 and at its clock output TS1. As a result of these pulses the stage A1 of the output register A is set to the stage "1" so that at the output AQ1 of said stage a signal having the value "1" is furnished. The stage A1 contains the sign bit of the digital information in the output register A; in the case outlined the value "1" in the stage A1 means a positive sign of the sampled analog voltage. The signal at the output AQ1 passes to the input VZU/D of the precounter VZ and to the input HZU/D of the main counter HZ. The two counters are set to the up counting mode by this signal.

The control circuit STS now furnishes at its outputs ES2 to ES8, SS2 to SS8 and TS2 to TS8 in the sequence apparent from the pulse diagram of FIG. 2 pulses which permit the quantized determination of the analog voltage at the input 14 of the comparator KOM and its conversion to a digital value in the output register A.

Firstly, the control circuit STS furnishes at the output ES2 a pulse which passes via the OR circuit O2 to the data input AD2 of the stage A2 of the output register A. Simultaneously with the pulse at the output ES2 a pulse appears at the output TS2 which passes to the clock input ACL2 of the output register A and effects that the stage A2 is set to the state "1". The output register A now contains in its stage A1, containing the information designating the sign of the analog voltage sampled at the input terminal 10, and in the stage A2 the signal value "1" whilst all other stages contain the signal value "0". Since as mentioned above the multiple switch S4 is disposed in the switching position indicated in full line the digital signal contained in the output register A passes to the digital-analog converter DAU which converts it to an analog voltage which has the magnitude associated with the highest binary place value and the sign stored in the stage A1, i.e. is positive in the case assumed. This voltage is applied via the switches S3 and S1 to the capacitor C1. Thus, at the inputs 14 of the comparator KOM a voltage appears which corresponds to the difference between the sampling value stored in the capacitor C1 and the voltage now furnished by the digital-analog converter DAU. If the voltage at the input 14 is still lower than the voltage 0 V at the input 15 of the comparator KOM said comparator again furnishes at the output 17 a signal having the value "1" which passes to an input of the AND circuits U1 to U8. The control circuit STS now furnishes at its outputs SS2 and TS2 a pulse and as a result the AND circuit U2 furnishes a signal with the value "1" which passes via the OR circuit O2 to the data input AD2 of the stage A2 of the output register A. The pulse applied to the clock input ACL2 of the stage A2 effects the carrying over of the information at the data input AD2 into the stage A2 of the output register A but in the example outlined this has no effect because in this stage A2 a signal having the value "1" was already stored.

There now appears that the output ES3 of the control circuit STS a pulse which passes via the OR circuit O3 to the data input AD3 of the stage A3 of the output register A. With the clock pulse simultaneously appearing at the output TS3 of the control circuit STS, the stage A3 is set to the condition "1". The digital information contained after this step in the output register A3 is again converted by the digital-analog converter DAU to an analog voltage which is applied to the capacitor C1. The result at the input 14 of the comparator KOM is the difference between the sampling value stored in the capacitor C1 and the voltage value from the digital-analog converter DAU. It will be assumed that the voltage at the input 14 is now higher than the voltage at the input 15 and as a result the comparator KOM furnishes at its output 17 a signal having the value "0". This signal passes to the connected inputs of the AND circuits U1 to U8. The control circuit STS now furnishes at the outputs SS3 and TS3 a pulse and the pulse at the output TS3 effects that the signal value present at the data input AD3 is carried into the stage A3 of the output register. Since the signal value "0" is present at the inputs of the AND circuit U3, the AND circuit furnishes at its output a signal having the value "0" which passes via the OR circuit O3 to the data input AD3. The value "0" is therefore written into the stage A3 of the output register A.

The remaining stages of the output register A are now successively set in the manner outlined to the value "1", whereupon the digital-analog converter DAU furnishes an analog voltage corresponding to the information in the output register A which is then applied to the capacitor C1. The comparator KOM then compares the analog voltages at its inputs 14 and 15 with each other. Depending on whether the voltage at the input 14 or at the input 15 is higher, the comparator KOM furnishes at its output 17 a signal having the value "0" or "1" which is written into the stage of the output register A last set by the control circuit STS to the value "1". After the last stage A8 of the output register A has been set to the value "1" by the control circuit STS and the output signal appearing at the output 17 of the comparator KOM has been written into the stage A8, the output register A receives the digital value corresponding to the analog voltage sampled at the input terminal 10, which can be taken from the output 32 for the further processing.

The output register illustrated in FIG. 1 consists of eight stages A1 to A8 of which the first indicates the sign of the digital numerical value stored in the output register whilst the stages A2 to A8 contain the magnitude of the numerical value. This means that for the analog voltage at the input terminal 10 a total of 128 quantising stages is available. If for example the analog voltage at the input terminal 10 can have values between +2.5 V and −2.5 V, with linear conversion the smallest quantisation step which can be expressed by the lowest value bit in the stage A8 of the output register A corresponds to 0.0195 V.

After the complete conversion of the analog voltage sampled at the input terminal 10 to a corresponding digital value in the output register A and withdrawal of said digital value the control circuit STS furnishes before the start of the next sampling cycle at its output SW0 a pulse which passes to the input VZCL of the precounter VZ so that the latter is advanced from the state "0" to the state "1" because due to the signal value "1" in the stage A1 of the output register A it is switched to the up counting mode. The same pulse SW0 is applied via a delay circuit 20 to the reset input AR of the output register A, whereby all the stages A1 to A8 are set to "0".

Before the start of the next sampling cycle a pulse is again furnished at the output SW3 of the control circuit STS and brings the switches S3 and S4 into the switching positions indicated in dashed lines. In these switching positions the digital-analog converter DAU receives via the switch S4 the information contained in the main counter HZ and applies a compensation voltage corresponding to this information to the input 15 of the comparator KOM. Since the state of the main counter HZ has not changed in the meantime the voltage 0 V which is stored in the capacitor C2 is again applied to the input 15 of the comparator KOM.

A change of the count of the main counter HZ is effected by each signal of the value "1" furnished by the output 31 of the NOR circuit N. The NOR circuit N furnishes a signal "1" whenever the value "0" is in the counter stages VZ1 to VZ4 and the value "1" is in the counter stage VZ5; it thus forms a decoder which detects when the count "16" is reached in the precounter VZ.

The purpose of providing the precounter VZ and the NOR circuit N before the main counter HZ is that the count of the main counter HZ will change only when the analog voltage at the input terminal 10 includes an offset voltage and is not compensated. When the analog voltage applied to the input terminal 10 is completely free of offset, i.e. has no DC voltage component, the analog voltage values sampled by the switch S1, considered over a relatively large number of periods of the analog voltage, have just as many positive as negative values. The stage A1 of the output register A in which the bit representing the sign of the converted digital information is stored thus contains, considered over a relatively long time, the value "1" (corresponding to a positive value of the sampled analog voltage) just as often as the value "0" (corresponding to a negative value of the sampled analog voltage). Since the information contained in the stage A1 defines the counting direction of the precounter VZ, the latter never reaches the count at which the NOR circuit N furnishes a signal "1" if the condition is observed that said count is greater than the greatest number occurring of the sampling values formed in a half cycle of the analog voltage. In the example illustrated in FIG. 1 the count with constant counting direction is reached with the sixteenth clock pulse at the clock input VZCL; the analog voltage at the input terminal 10 must therefore not be sampled more than 15 times in the longest half cycle occurring or, considered another way, the frequency of the analog voltage must not be below a corresponding lower limit value.

Since the main counter HZ receives a pulse and changes its count only when the count "16" is reached in the precounter VZ, i.e. the NOR circuit N furnishes an output pulse at the output 31, in the case assumed of an offset-free analog voltage the condition of the main counter HZ is not changed. For this count of the precounter VZ is not reached because the precounter, due to the equal number of positive and negative sampling values occurring, always counts alternately up and down and thus changes the counting direction before the count "16" occurs. The unchanged condition of the main counter HZ means that before the start of each sampling cycle, the digital-analog converter DAU always applies the same compensation voltage with the value 0 V to the output 15 of the comparator KOM.

The above description related to the conversion of an offset-free analog voltage at the input terminal 10 to a sequence of digital sampling values which can be taken from the output 32. However, in practice such offset-free analog voltages hardly occur because as explained at the beginning before application to the input terminal 10, the analog voltage is passed through low-pass filters to fulfill the Shannon sampling theorem. These low-pass filters, which are made in integratable circuits as active filters, can lead to the production of an undesirable DC voltage component in the AC voltage to be converted. Additionally, other components of the circuit arrangement, for example the comparator KOM, can contribute to the generation of this undesired DC voltage component. It will now be explained how the circuit arrangement illustrated in FIG. 1 behaves in the conversion of analog voltage signals with DC voltage component and in particular in the compensation of such an undesirable DC voltage component.

It will be assumed that the analog voltage applied to the input terminal 10 contains a positive DC voltage component. As in the above example, in a first step a sampling value of the analog voltage is formed by switching the switch S1 by means of a pulse which the control circuit STS furnishes at the output SW1. This sampling value is converted in the same manner as described in detail above to a corresponding digital value in the output register A. Initially, as before the voltage 0 V is at the input 15 of the comparator KOM because the digital-analog converter DAU has produced this voltage from the information contained in the main counter HZ whose content has initially been set to the value "0". Because of the positive DC voltage component in the analog voltage at the input terminal 10, considered over a relatively large number of periods of the analog voltage, more positive than negative sampling values will occur at the capacitor C1 so that the sign bit in the stage A1 of the output register A assumes the value "1" representing the positive sign more often than the value "0" representing the negative sign. As a result, the precounter VZ is switched by the bit of the stage A1 to the up counting mode more often than to the down counting mode. Taken over a longer period, due to the advancing by clock signals at its input VZCL the precounter will finally move from the count "15" (01111) to the count "16" (10000) which results in the furnishing of a signal "1" at the output of the NOR circuit N.

The corresponding effect occurs when the number of the negative sampling values predominates so that the precounter VZ is switched to the down counting mode more often than to the up counting mode. With the first predominantly negative sign the precounter VZ moves from the count "0" (00000) down to the count "31" (11111) and with the sixteenth predominant count pulse a change takes place from the count "17" (10001) to the count "16" (10000) which results in a signal having the value "1" being furnished at the output 31 of the NOR circuit N.

The signal with the value "1" at the output 31 of the NOR circuit N passes to the clock input HZCL of the main counter HZ and results in the condition thereof being advanced by one unit in the counting direction defined by the sign bit in the stage A1 of the output register A. The main counter HZ is now no longer in the condition "0" so that at the start of the next conversion cycle the digital-analog converter DAU produces an analog voltage at the input 15 of the comparator KOM corresponding to this count different from zero. In the highest value stage HZ10 of the main counter HZ the bit representing the sign of the information in the main counter HZ is contained so that the digital-analog converter DAU produces the analog voltage taking account of the sign. In the previously assumed example of a predominant number of positive sampling values the advancing of the main counter HZ takes place whilst the value "1" representing the positive sign is stored in the stage A1 of the output register A so that the main counter HZ is switched to the up counting mode. It therefore moves from the count "0" (00...00) to the count "+1" (00...01) because the value "0" in the stage HZ10 represents the positive sign. The digital-analog converter DAU, which receives the signal value "1" from the output $\overline{HZQ10}$, therefore produces a positive compensation voltage with the smallest stage value provided.

The analog voltage applied by the digital-analog converter DAU to the input 15 of the comparator KOM and stored in the capacitor C2 acts permanently in the sense of a compensation of the DC voltage component contained in the analog voltage at the input 10. A complete compensation of the DC voltage component is achieved when, considered over a relatively long period, just as many bits with the value "0" as bits with the value "1" pass to the stage A1 of the output register A. If the compensation voltage applied to the input 15 of the comparator KOM is not sufficient for complete compensation of the positive DC voltage component the precounter VZ will continue to count more often in the up direction than in the down direction and as a result produce further output pulses at the output 30 of the NOR circuit N which increase the count of the main counter HZ. The increased count of the main counter HZ leads to the digital-analog converter DAU applying a higher compensation voltage to the input 15 of the comparator KOM. As soon as the DC voltage component is completely compensated the main counter HZ no longer receives pulses from the precounter VZ so that consequently the voltage value at the output 15 of the comparator KOM is no longer changed.

When a negative DC voltage component is present in the analog signal at the input terminal 10 the main counter HZ is connected in the advancing by the pulse coming from the output 31 of the NOR circuit N in the down counting mode because the value "0" representing the negative sign is in the stage A1 of the output register A. Proceeding from the count "00...00" the main counter HZ moves to the count "11...11"; thus, a change of the content of the counter stage HZ10 takes place which means a change in sign. Since the digital-analog converter DAU now receives the signal value "0" from the output $\overline{HZQ10}$, it produces a negative compensation voltage. The magnitude of this negative compensation voltage is determined by the complementary values of the binary digits in the counter stages HZ1 to HZ9 because simultaneously with the change in sign a switching of the multiple switch S5 takes place so that the digital-analog converter DAU now receives the digital information from the negating outputs $\overline{HZQ1}$ to $\overline{HZQ9}$. Details of the counting mode of the main counter and the transfer of the information contained therein will be explained hereinafter with reference to FIG. 3.

It is apparent in FIG. 1 that the signal "1" furnished by the output 31 of the NOR circuit N is also applied to the data input FFD of the flip-flop FF. Thus, with the trailing edge of the next clock signal at the output SW0 of the control circuit STS the flip-flop FF is set to the condition "1" so that it furnishes at its output FFQ a signal which sets the precounter VZ back to the state "0". A result of this is that the precounter VZ always again reaches the count "16" only when the number of advancing operations taking place in one counting direction was 16 greater than the number of advancing operations taking place in the other counting direction. Without this circuit provision it could happen that the precounter VZ, after reaching the count "16" at which the NOR circuit N furnishes a signal "1", on rapid change of the counting direction oscillates repeatedly between the counts "15" and "16" or "16" and "17", which would result in a signal "1" being furnished at the output 31 each time. By employing the NOR circuit N and the flip-flop FF, after each time the count "16" has been reached a resetting of the precounter VZ takes place so that this count can only be reached again with the sixteenth predominant advancing pulse in the same counting direction.

As already explained above the stage HZ10 of the main counter HZ serves to provide the digital-analog converter DAU with information on the sign of the analog voltage to be produced. At the same time, the content of the stage HZ10 also defines whether the content of the stage HZ1 to HZ9 is transmitted in direct form or in complementary form to the digital-analog converter DAU. This provision has the following purpose:

As already explained above the digital information in the main counter HZ is converted by the digital-analog converter DAU to an analog voltage which is applied via the switch S3 to the input 15 of the comparator KOM as compensation voltage for any DC voltage component which might be present in the input signal. The information in the main counter HZ consists of nine bits which are stored in the stages HZ1 to HZ9 and of a sign bit stored in the tenth stage HZ10. The main counter HZ counts with each pulse applied to its clock input HZCL up or down depending on the signal at the input HZU/D.

To facilitate understanding of the mode of operation of the main counter HZ in the Table of FIG. 3 the output signals are illustrated together which are obtained at the outputs of the counter stages for a plurality of signals applied consecutively to the clock input HZCL. For simplification, only the output signals at the four counter stages HZ1, HZ2, HZ3 and HZ10 are shown. The signal values at the non-negating outputs HZQ1, HZQ2, HZQ3 ... HZQ10 correspond to the content of the counter stages. For each count the corresponding digital numerical value is given with the sign defined by the content of the counter stage HZ10. A star denotes the signals which corresponding to the position of the multiple switch S5 are transferred to the digital-analog converter DAU. Finally, the signal at the input HZU/D is illustrated which defines the counting direction and comes from the output AQ1 of the output register A.

The initial position is "0" in which all the counter stages HZ1 to HZ10 have the content "0". This corresponds to the numerical value "0". The content "0" of the stage HZ10 indicates the positive sign. Accordingly, the signals at the non-negating outputs HZQ1 to HZQ9 are transmitted to the digital-analog converter. The latter generates a compensation voltage of 0 V.

The signal at the input HZU/D has the value "1" which denotes the up counting direction. Accordingly, the first pulse reaching the clock input HZCL brings the counter stage HZ1 to the condition "1" whilst the other counter stages retain the count "0". This count corresponds to the numerical value "+1" which is supplied to the digital-analog converter DAU. The latter produces a positive compensation voltage whose magnitude corresponds to the smallest compensation voltage step provided.

If the compensation voltage produced in this manner is not adequate to compensate the positive DC voltage component of the analog voltage, when the next counting pulse is applied the signal "1" is again at the input HZU/D so that the main counter HZ is again advanced in the up direction. Its count then corresponds to the numerical value "+2" which is transferred to the digital-analog converter DAU which then produces a correspondingly greater positive compensation voltage. The same operation can continue in the up counting direction until a count is reached which corresponds to a positive numerical value effecting the complete compensation of the DC voltage component.

It is assumed in FIG. 3 that on application of the next counting pulse after reaching the numerical value "+3" at the main counter the down counting direction is set which occurs when the DC voltage component to be compensated becomes lower. The following counting pulses are therefore counted in the downward direction so that the main counter HZ passes through the values "+2" and "+1" in the reverse direction until it again reaches the count "0" in which all the counter stages HZ1 to HZ10 have the count "0".

With the next pulse counted in the down direction all the counter stages HZ1 to HZ10 move to the state "1". This corresponds to the highest possible count of the binary counter. Since the change in the counter stage HZ10 signifies the change from the positive to the negative sign, the new count would correspond to the numerical value "−511" if the direct output signals were further transferred from the outputs HZQ1 to HZQ9 to the digital-analog converter DAU. This undesirable condition is avoided in that simultaneously the multiple switch S5 is brought into the other switching position so that now the complementary signals are transferred from the negating outputs $\overline{HZQ1}$ to $\overline{HZQ9}$ to the digital-analog converter DAU. The latter thus receives at all signal inputs the digital value "0", the signal value "0" at the sign input denoting the negative sign and the signal values "0" at the remaining signal inputs the quantity "0". The digital-analog converter DAU interprets this state as the value "−0" which effects the production of a compensation voltage of "−0 V".

Thus, for the digital-analog converter DAU a change has taken place from the value "+0" to the value "−0". The occurrence twice of the value "0" is however of no significance because the main counter HZ is in a control circuit which finally adjusts itself to the necessary compensation value.

With the next pulse counted in the down direction the content of the counter stage HZ1 now changes from "1" to "0". In the signals transmitted to the digital-analog converter DAU this results in a change of the last binary digit from "0" to "1" whilst all the other binary digits and the sign bit retain the value "0". For the digital-analog converter DAU this signifies the numerical value "−1" which is converted to a next compensation voltage of the smallest voltage step.

The further pulses counted in the down direction give the value "−2" and "−3" which are converted to correspondingly greater negative compensation voltages.

It is assumed in FIG. 3 that after reaching the value "−3" a change of the counting direction again takes place so that the main counter passes successively through counts which correspond to the values "−2", "−1", "−0", "+0", "−1". On changing from "−0" to "+0" a sign change occurs as does the switching over of the multiple switch S5 so that thereafter the digital-analog converter DAU again receives the direct output signals from the output HZQ1 to HZQ9.

It is apparent from the foregoing description that the main counter HZ in conjunction with the precounter VZ forms a sign integrator which continuously integrates the sign of the sampling values of the analog voltage. The integration result obtained contains information on whether the number of the positive sampling values is greater or smaller than the number of the negative sampling values. The construction as counter has the advantage that it also provides quantitative information which can be converted directly to a corresponding compensation voltage. This integration result is combined with the sampling value so that the desired compensation of the DC voltage component is obtained.

In the circuit arrangement illustrated the number of the stages of the main counter HZ is greater than the number of the stages of the output register A. The multiple switches S4 and S5 are so formed that the output signals of the stages HZ1 to HZ10 can be switched through to the digital-analog converter DAU. The multiple switch S5 contains nine switches with which the output signals of the stages HZ1 to HZ9 can be switched through to the inputs 30 of the switch S4. The signal of the stage HZ10 furnished by the output $\overline{HZQ10}$ is applied directly to one of the inputs 30. The multiple switch S4 includes ten switches with the aid of which it can pass the signals applied to its inputs 29 or 30 to the digital-analog converter DAU. The outputs of the stages A1 to A8 are led to the inputs 29 of the multiple switch S4 in such a manner that the output of the stage A1 leads to the switch which is also responsible for the passing of the sign signal from the stage HZ10 of the main counter HZ, and the outputs of the stages A2 to A8 are connected in succession to the switches in the multiple switch S4 which are responsible for passing the signals from the stages HZ9 to HZ3. Because of the lower number of the stages in the output register A in the switching position of the switches in the multiple switch S4 illustrated in full lines in the Figure the inputs 29 of the two switches which in the dashed switching position pass the output signals of the stages HZ1 and HZ2 of the main counter to the digital-analog converter DAU remain unoccupied. This is an advantageous embodiment of the circuit arrangement because as a result the resolving power of the compensation voltage applied to the comparator KOM is smaller than the changes of the sampling value applied to the input terminal 10 still to be resolved. Thus, for example, changes in the compensation voltage by a minimum change step with constant sampling value at the input terminal 10 do not result in any change of the state of the output register A. The circuit arrangement must be so designed that it tolerates small changes of the compensation voltage because the circuit arrangement itself in the steady-state condition may exhibit system-inherent changes of the compensation voltage by one change step in the positive and in the negative direction.

This change in the compensation voltage in the steady-state condition may result because the comparator KOM cannot detect the exact identity of the voltages applied to its inputs 14 and 15; it always only indicates whether the voltage applied to its input 14 is higher or lower than the compensation voltage applied to its input 15. This means that even after setting the correct compensating voltage value the precounter VZ can reach its count "16" and thus initiate furnishing of a pulse to the main counter HZ. Although this pulse, which changes the information stored in the stage HZ1, results in a change in the compensation voltage produced by the digital-analog converter DAU, this change is so small that it has no effect on the information contained in the output register A, as already explained above.

In the circuit arrangement described the value of the compensation voltage required at a particular time is stored in digital form in the main counter HZ. This results in the advantage that the build-up time of the circuit arrangement after interrupting operation is greatly reduced because the compensation voltage value need not be formed in a relatively large number of operating cycles but is already present in digitally stored form. It may be assumed that the compensation voltage value required after an interruption in operation differs very little from the value set before the interruption in operation.

In the circuit arrangement described the analog voltage applied to the input terminal 10 is sampled with the frequency usual in PCM technique which in the telephone art is 8 kHz. For this purpose the switches S1 and S2 are switched with pulses SW1 having this recurrence frequency from the control circuit STS briefly into the switching position indicated in dashed line. In the interval between two sampling pulses the conversion to the digital value finally formed in the output register A takes place as described in detail above. This conversion operation does not require the entire time available between two sampling pulses. Following the conversion operation and before a new sampling pulse the compensation voltage is produced by converting the information contained in the main counter HZ and applied to the input 15 of the comparator KOM. For the analog-digital conversion of the subsequently sampled analog voltage value the compensation voltage is stored in the capacitor C2.

The comparator KOM illustrated in FIG. 1 has two functions; it combines the voltages applied to its inputs 14 and 15 by forming the difference and decides whether the combination result is above or below a predetermined threshold value. The comparator KOM could therefore also consist of a summing member and a threshold value circuit.

The switches S3 and S4 permit double utilization of the digital-analog converter DAU, i.e., firstly for the conversion of the analog sampling value to a digital sampling value and secondly for the production of the compensation voltage. It would also be possible to use a separate digital-analog converter for each of these functions which would then make the switches S3 and S4 and capacitor C2 superfluous.

The switches in the multiple switches S4 and S5 are in practice electronic switches comprising complementary controlled field-effect transistors.

The circuit arrangement described may be made in the form of an integrated circuit so that it can be produced economically in large numbers. It can be used in all cases where signals are to be transmitted using the pulse code modulation technique, for example, in the telephone are and in digital sound and picture recording.

We claim:
1. A circuit arrangement for converting an analog signal to a digital signal comprising:
    means for cyclically sampling the analog signal and forming analog sampling values therefrom; and means for converting the analog sampling values to digital sampling values; said converting means comprising,
    analog to digital converter means;
    means coupled to said analog-digital converter means for integrating the signs of the digital sampling values, comprising counter means having a reversible counting direction dependent upon the sign of the digital sampling value, said counter means comprising,
    precounter means;
    main counter means;
    decoding means coupled to the output of said precounter means and to the input of said main counter means for generating an output signal when said precounter means reaches a predetermined count, wherein upon the occurrence of said decoding means output signal said precounter means is reset and said main counter means is advanced one count, said decoding means comprising,
    a NOR circuit having a plurality of inputs and an output, wherein one of said inputs is connected to the negating output of the highest value stage of said precounter means, said other NOR circuit inputs are connected to the non-negating outputs of said other stages of said precounter means, and said NOR circuit output is connected to the input of said main counter means; and
    a bistable flip-flop circuit connected to said NOR circuit output and to said precounter means for resetting said precounter means upon the occurrence of an output signal from said NOR circuit;
    means for generating a compensation voltage in dependence upon the output of said integrating means, said compensation voltage generating means comprising digital-analog converter means for converting the accumulated digital count in said counter means into a compensation voltage;
    means for combining said compensation voltage with the analog sampling value from said sampling means, wherein the output of said combining means is coupled to said analog-digital converter means and
    means for storing said compensation voltage.
2. The circuit arrangement of claim 1, wherein the number of stages in said main counter means is greater than the number of bits in one of said digital sampling values.
3. The circuit arrangement of claim 1, further comprising:
    switch means coupled to said digital-analog converter means and to said main counter means, wherein in dependence upon the state of the highest value stage of said main counter means said switch means couples either the negating or the non-negating outputs of the remaining stages of said main counter means to said digital-analog converter means.

* * * * *